United States Patent
Nakagawa

(10) Patent No.: US 6,768,349 B2
(45) Date of Patent: Jul. 27, 2004

(54) MULTIPLE-OUTPUT ARBITRARY WAVEFORM GENERATOR AND MIXED LSI TESTER

(75) Inventor: Hiroshi Nakagawa, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/466,455

(22) PCT Filed: Jan. 11, 2002

(86) PCT No.: PCT/JP02/00154
§ 371 (c)(1),
(2), (4) Date: Jul. 11, 2003

(87) PCT Pub. No.: WO02/056042
PCT Pub. Date: Jul. 18, 2002

(65) Prior Publication Data
US 2004/0070410 A1 Apr. 15, 2004

(30) Foreign Application Priority Data
Jan. 12, 2001 (JP) ........................................ 2001-004824

(51) Int. Cl.⁷ ........................ H03K 17/00; G01R 31/28
(52) U.S. Cl. ...................... 327/100; 714/738; 714/740; 714/742
(58) Field of Search .................. 327/100; 714/738–740, 714/742

(56) References Cited

U.S. PATENT DOCUMENTS
6,654,916 B1 * 11/2003 Furukawa ................... 714/724

FOREIGN PATENT DOCUMENTS
JP 9-64745 3/1997
JP 11-38094 2/1999
JP 11-337616 12/1999

* cited by examiner

Primary Examiner—Kenneth B. Wells
(74) Attorney, Agent, or Firm—Muramatsu & Associates

(57) ABSTRACT

There are disposed an output sequence control section, and output waveform data generation section for one system, and an analog waveform generation section includes four systems of ports 40, attenuators 43b for individually adjusting gains of analog test signals outputted via the respective ports, and digital/analog converters 45 for individually adjusting offset voltages of the analog test signals. Accordingly, when a plurality of LSIs to be tested are concurrently tested, the analog test signals optimized for each LSI to be tested are generated with a simple circuit configuration without complicating the circuit configuration of a performance board.

3 Claims, 4 Drawing Sheets

MULTIPLE-OUTPUT ARBITRARY WAVEFORM GENERATOR AND MIXED LSI TESTER

TECHNICAL FIELD

The present invention relates to a multiple-output arbitrary waveform generator and a mixed LSI tester including the unit, particularly to a concurrent measurement technique of concurrently testing a plurality of devices.

BACKGROUND ART

An LSI test apparatus applies analog test signals to LSIs to be tested and performs a test based on a test sequence specific to a type of each LIS to be tested. The LSI test apparatus includes an arbitrary waveform generator in order to generate the analog test signals.

Here, a constitution of a conventional arbitrary waveform generator will be described with reference to FIG. 3.

As shown in FIG. 3(A), an arbitrary waveform generator 1 is constituted of an output sequence control section 11, output waveform data generation section 12, and analog waveform generation section 13.

The output sequence control section 11 outputs a test sequence signal S1 based on the test sequence specific to the type of an LSI to be tested (DUT) 3 to control the output waveform data generation section 12. The output waveform data generation section 12 generates an output waveform data signal S2 in accordance with the test sequence signal S1.

The analog waveform generation section 13 digital/analog-converts the waveform data signal S2 outputted from the output waveform data generation section 12, and generates an analog test signal S3. The analog test signal S3 is applied to the LSI to be tested (DUT) 3 laid on a performance board 2. The performance board 2 functions as an interface board (I/F board) with the DUT 3. The performance board 2 for exclusive use in each type of the LSI to be tested 3 is used.

Moreover, as shown in FIG. 3(B), the analog waveform generation section 13 includes a digital/analog converter (D/A) 41, a low pass filter (LPF) 42, an attenuator (ATT) 43, a differential section 44, and a digital/analog converter for offset (D/A) 45.

The output waveform data signal S2 inputted into the analog waveform generation section 13 is converted to an analog test signal by the digital/analog converter (D/A) 41. Subsequently, when this analog test signal is passed through the low pass filter (LPF) 42, high-frequency noise components are removed.

Now a signal amplitude (gain) of the analog test signal in this stage sometimes exceeds an allowable range of an input signal amplitude in the DUT 3. Then, the signal amplitude of the analog test signal is adjusted by the attenuator 43 so that the signal amplitude of the DUT 3 falls within the allowable range.

Subsequently, the differential section 44 generates a differential analog test signal constituted of positive and negative signals from the analog test signal.

Furthermore, for the DUT 3, there is an allowable range in an offset voltage of the input signal. Then, a DC offset signal S4 in the allowable range is digital/analog-converted by the digital/analog converter for offset 45 to generate an offset voltage V of the same phase as that of the differential analog test signal. Moreover, the offset voltage V is added to the differential analog test signal, and the offset-adjusted differential analog test signal is outputted via ports 40.

Accordingly, with respect to the LSI to be tested, the differential analog test signal whose gain and offset are optimized is inputted into the DUT 3.

In the LSI test apparatus constituted in this manner, in recent years, a test method called concurrent measurement has been used. In the method, a plurality of DUTs 3 are laid on the performance board 2, and are concurrently tested. When an LSI test is carried out by the concurrent measurement, the plurality of DUTs 3 can concurrently be tested, and a test time can be reduced.

However, there are dispersions with the DUTs 3 in a width of an allowable range of the input signal amplitude of the DUT 3 or an offset voltage allowable range. Therefore, in order to carry out the LSI test by the concurrent measurement, in general, as shown in FIG. 4(A), it is necessary to dispose the same number of arbitrary waveform generators 1, per performance board 2, as that of the LSIs to be tested laid on the performance board 2. As a result, there arises a problem that the LSI test apparatus is enlarged, and cost of the LSI test apparatus increases.

For example, in an example shown in FIG. 4(A), four systems of arbitrary waveform generators 1 are disposed in order to perform the concurrent measurement with respect to four DUTs 3.

Furthermore, when two types of analog test signals need to be applied to one DUT 3 in the LSI test, eight systems of arbitrary waveform generators 1 need to be disposed in order to perform the concurrent measurement of four DUTs. Therefore, the LSI test apparatus is further enlarged, and the cost increases.

To solve the problem, as shown in FIG. 4(B), a method of distributing the analog test signal S3 outputted from one arbitrary waveform generator 1 on the performance board 2 to apply the signals to the plurality of DUTs 3 has been proposed.

However; in this method, it is difficult to individually adjust the gains and offsets of the analog test signals in accordance with the allowable range of the individual DUTs 3. Therefore, there is a problem that it is difficult to apply the analog test signal optimized for each DUT 3.

Additionally, since it is necessary to control the distribution of the analog test signals on the performance board 2, the circuit configuration of the, performance board 2 is complicated, and a test program is also complicated.

The present invention has been developed to solve the above-described problem, and an object thereof is to provide a multiple-output arbitrary waveform generator in which the analog test-signal optimized for each LSI to be tested can be generated with a simple circuit configuration without complicating the circuit configuration of the performance board in concurrently testing the plurality of LSIs to be tested, and a mixed LSI tester including the generator.

DISCLOSURE OF THE INVENTION

According to the present invention, there is provided a multiple-output arbitrary waveform generator comprising: an output waveform data generation section for generating an output waveform data signal for an LSI test; an output sequence control section for controlling the output waveform data generation section based on a test sequence specific to an LSI to be tested; and an analog waveform generation section for digital/analog-converting an output waveform data signal outputted from the output waveform data generation section to apply the signals to a plurality of LSIs to be tested, wherein the analog-waveform generation section comprises: a gain adjustment section including a plurality of ports via which the analog test signals applied to the plurality of LSIs to be tested are individually outputted to individually adjust gains of the analog test signals outputted via the ports; and an offset adjustment section for individually adjusting offset voltages of the analog test signals.

Accordingly, the multiple-output arbitrary waveform generator of the present invention distributes the analog test signals in the analog waveform generation section, and outputs the signals via the plurality of ports. Therefore, even when the plurality of LSIs to be tested are tested by the concurrent measurement, the output sequence control section and output waveform data generation section can be constituted in one system.

Additionally, the distributed analog test signals are individually optimized for each LSI to be tested by the gain adjustment section and offset adjustment section of the analog waveform generation section.

Accordingly, when the plurality of LSIs to be tested are concurrently tested, the analog test signal optimized for each LSI to be tested can be generated with a simple circuit configuration.

Furthermore, in the present invention, since the analog test signals are distributed and optimized in the analog waveform generation section, the test signal can be optimized for each device to perform the concurrent measurement test without complicating the circuit configuration of the performance board and without complicating the test program.

Moreover, the multiple-output arbitrary waveform generator of the present invention is a multiple-output arbitrary waveform generator according to claim 1, and comprises a concurrent measurement handling register for selecting a port via which the analog test signal is outputted from all the ports.

When the concurrent measurement handling register is disposed in the multiple-output arbitrary waveform generator, an output port can be selected to select the number of LSIs to be tested by the concurrent measurement. That is, a specific LSI can be excluded from test objects.

Moreover, according to the present invention, there is provided a mixed LSI tester comprising: a multiple-output arbitrary waveform generator for generating an analog test signal based on a test sequence specific to a type of an LSI to be tested; and a performance board on which a plurality of LSIs to be tested including the analog test signals applied thereto are laid, wherein the arbitrary waveform generator comprises: an output waveform data generation section for generating an output waveform data signal for an LSI test; an output sequence control section for controlling the output waveform data generation section based on the test sequence specific to the LSI to be tested; and an analog waveform generation section for digital/analog-converting the output waveform data signal outputted from the output waveform data generation section to generate the analog test signals to be applied to the plurality of LSIs to be tested, and the analog waveform generation section comprises: a gain adjustment section comprising a plurality of ports via which the analog test signals to be applied to the plurality of LSIs to be tested are individually outputted to individually adjust gains of the analog test signals outputted via the ports; and an offset adjustment section for individually adjusting offset voltages of the analog test signals.

Accordingly, since the mixed LSI tester of the present invention comprises the multiple-output arbitrary waveform generator similar to that of claim 1, the analog test signal optimized for each LSI to be tested can be generated with a simple circuit configuration in concurrently testing the plurality of LSIs to be tested.

BEST MODE FOR CARRYING OUT THE INVENTION

One embodiment of the present invention will be described with reference to FIG. 1.

Figure 1:
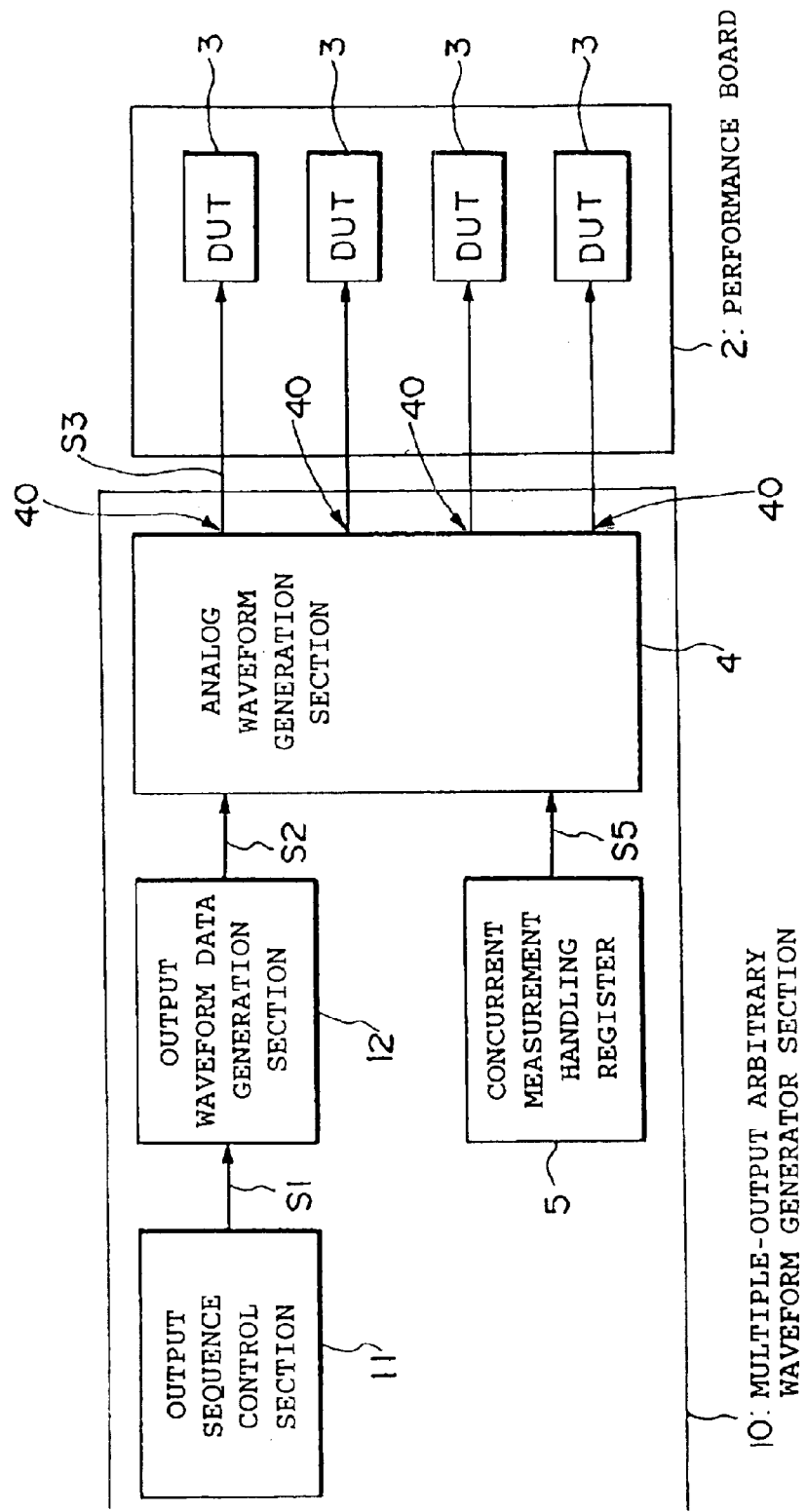
FIG. 1 is a block diagram showing constitutions of a multiple-output arbitrary waveform generator and mixed LSI tester according to an embodiment.

FIG. 1 shows a main constitution of a mixed LSI tester according to the embodiment.

As shown in FIG. 1, the mixed LSI tester of the embodiment includes a multiple-output arbitrary waveform generator 10 and performance board 2. The performance board 2 functions as an interface board with LSIs to be tested (DUT) 3. FIG. 1 shows that four DUTs 3 are laid in the performance board 2.

Moreover, the multiple-output arbitrary waveform generator 10 is constituted of an output sequence control section 11, an output waveform data generation section 12, an analog waveform generation section 40 including four ports 40, and a concurrent measurement handling register 5 in order to generate analog test signals based on a test sequence specific to a type of the LSI to be tested (DUT) 3.

Constituting elements will be described hereinafter.

The output sequence control section 11 outputs a test sequence signal S1 and controls the output waveform data generation section 12 based on the test sequence for the DUT 3.

The output waveform data generation section 12 generates an output waveform data signal S2 for the LSI test in accordance with the sequence signal S1.

Moreover, the output waveform data signal S2 is outputted to the analog waveform generation section 4.

Moreover, the analog waveform generation section 40 digital/analog-converts the output waveform data signal S2 outputted from the output waveform data generation section 12, and generates analog test signals S3 to be applied to four DUTs 3.

Here, the constitution of the analog waveform generation section 40 will be described with reference to FIG. 2.

Figure 2:
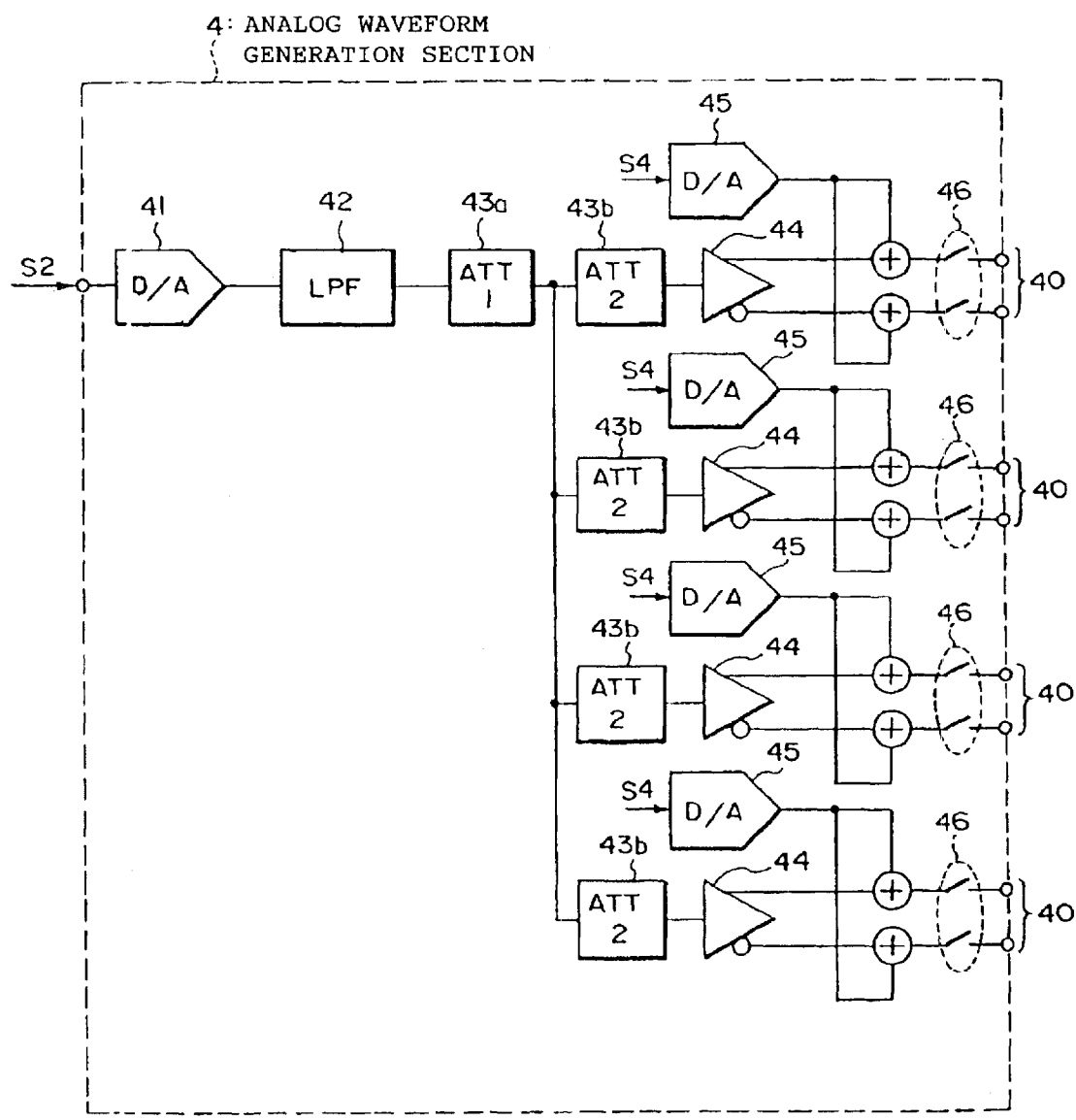
FIG. 2 is a block diagram showing the constitution of an analog waveform generation section of the embodiment.
Figure 3A:
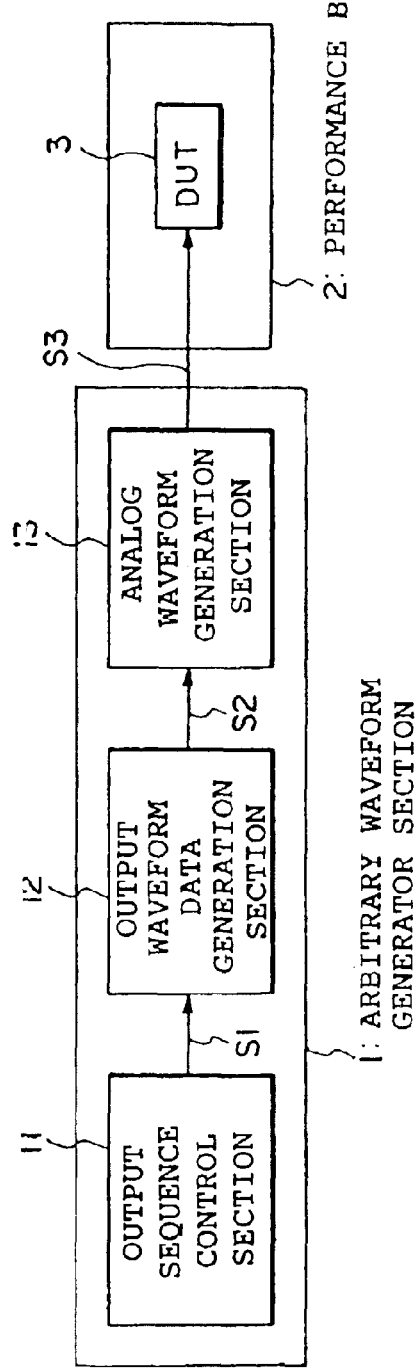
FIG. 3(A) is a block diagram showing the constitutions of a conventional arbitrary waveform generator and mixed LSI tester, and (B) is a block diagram showing the constitution of the analog waveform generation section of the related art.
Figure 3B:
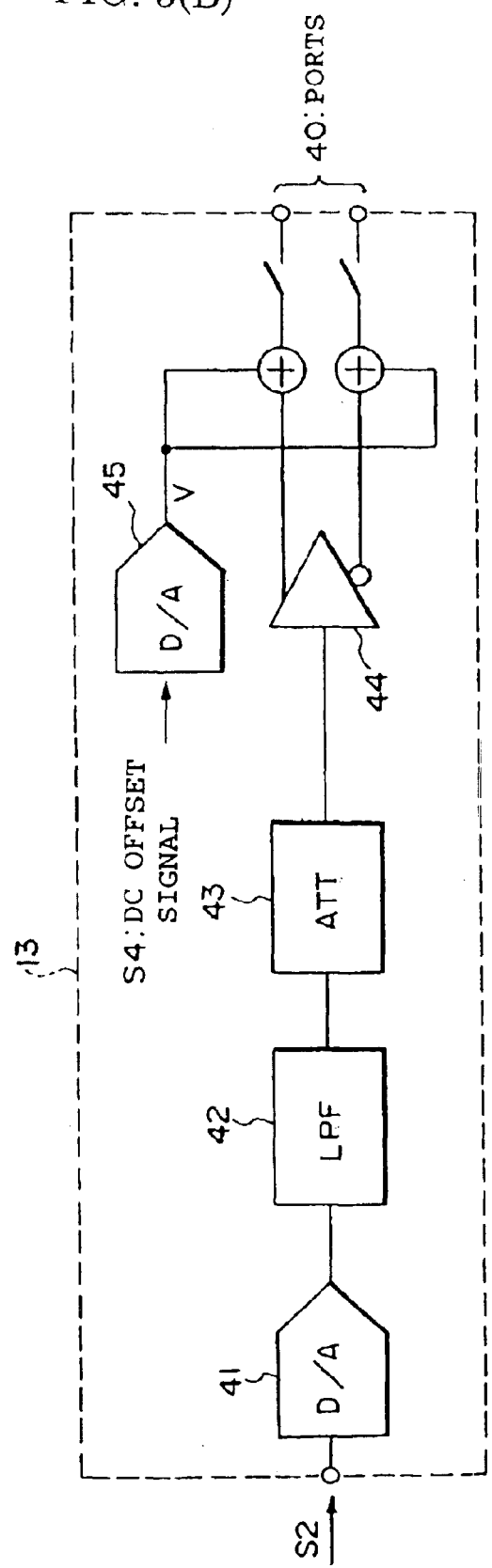
Figure 4A:
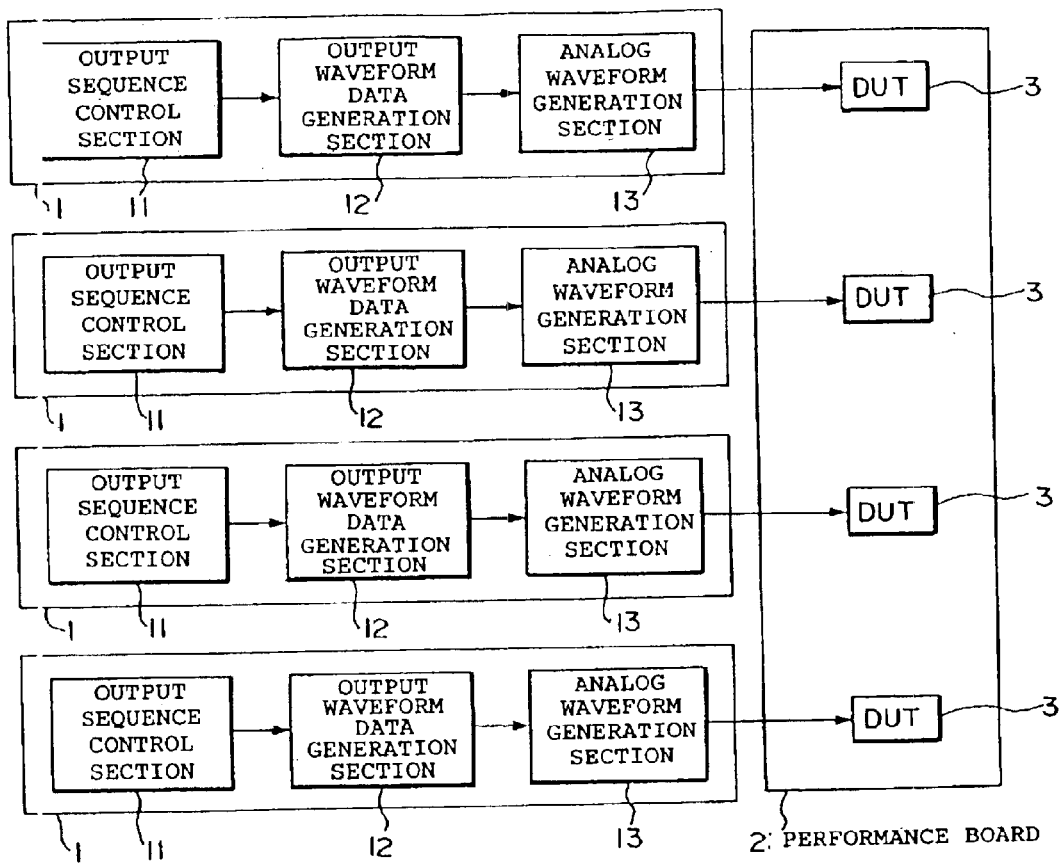
FIG. 4(A) is a block diagram showing the constitutions of the conventional arbitrary waveform generator and mixed LSI tester in which concurrent measurement is possible, and (B) is a block diagram showing the constitution of the conventional multiple-output arbitrary waveform generator and mixed LSI tester in which the concurrent measurement is possible.
Figure 4B:
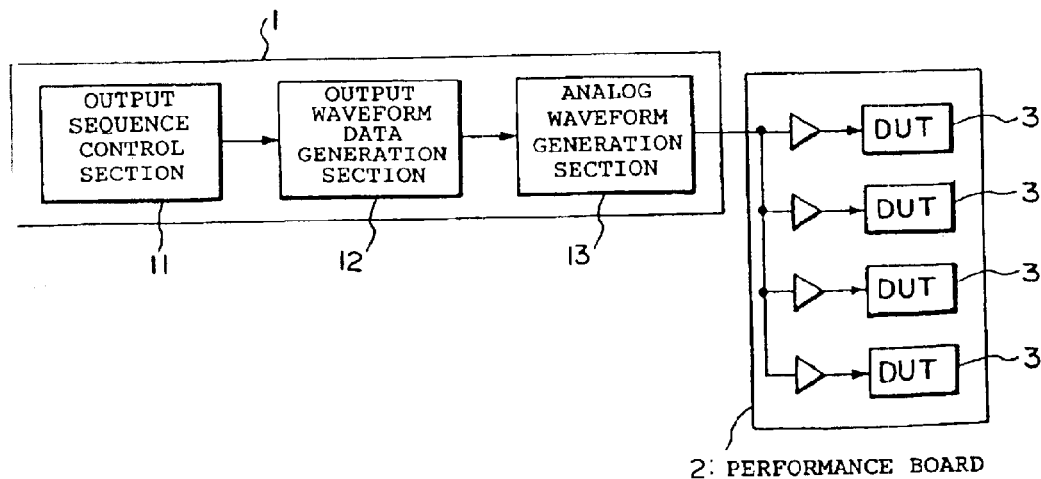

As shown in FIG. 2, the analog waveform generation section 40 includes a digital/analog converter (D/A) 41, a low pass filter (LPF) 42, and a first stage of attenuator (ATT1) 43a in one system. Furthermore, the analog waveform generation section 40 includes a second stage of attenuators (ATT2) 43b, differential sections 44, and digital/analog converters for offset adjustment (D/A) 45 for four systems.

Subsequently, the output waveform data signal S2 inputted into the analog waveform generation section 40 is first digital/analog-converted by the digital/analog converter 41 to generate an analog test signal. Subsequently, when this analog test signal is passed through the low pass filter 42, high-frequency noise components are removed. Furthermore, the first stage of attenuator 43a once gain-adjusts the signal amplitude of the analog test signal every 3 dB so that the amplitude substantially falls within an allowable range of the DUT 3.

Next, the analog test signal outputted from the first stage of attenuator 43a is distributed into four systems, and inputted into the second stage of attenuators 43b of four systems. For the respective analog test signals distributed into four systems, the gains are individually finely adjusted by the second stage of attenuators 43b so that the signal amplitude falls within the allowable range of each DUT 3. In the second stage of attenuators 43b, the gains are individually adjusted in an adjustment amplitude of 3 dB every 0.1 dB.

Subsequently, the differential sections 44 generate differential analog test signals including positive and negative signals from the gain-adjusted analog test signals.

Furthermore, offset voltages are added to the respective differential analog test signals of four systems in accordance with an offset voltage allowable range of the respective DUTs 3 to perform offset adjustment. The offset voltage is in the same phase as that of the differential analog test signal. These offset voltages are generated by digital/analog-converting DC offset signals S4 by the digital/analog converters for offset adjustment 45 in accordance with the offset voltage allowable range of each DUT 3.

The offset-adjusted differential analog test signal optimized for each DUT 3 connected to each port is outputted via each of the ports 40 of four systems in this manner.

Furthermore, in the present embodiment, the concurrent measurement handling register 5 controls the opening/closing of output switches 46 of the analog waveform generation section 4 for each port 40. Accordingly, the port via which the analog test signal is outputted can arbitrarily be selected from the ports 40 of four systems. As a result, the DUT 3 to be tested by the concurrent measurement can be selected. Accordingly, the test can be carried out with respect to the arbitrary DUT 3 by the concurrent measurement without complicating the test program.

The present invention has been described with respect to an example constituted on specific conditions in the above-described embodiment, but the present invention can variously be changed. For example, in the above-described embodiment, the example in which four DUTs 3 are laid on the performance board has been described, but the number of DUTs is not limited to four in the present invention. For example, two DUTs may be tested by the concurrent measurement, or eight DUTs may be tested by the concurrent measurement.

Moreover, for example, in the above-described embodiment, the same offset signal is added to both the positive and negative signals of the differential analog test signal, but in the present invention, the offset signals different in intensity from each other may separately be added to the positive and negative signals.

As described above, according to the multiple-output arbitrary waveform generator and mixed LSI tester of the present invention, in the analog waveform generation section, the analog test signals are distributed and outputted via the plurality of ports. Therefore, even when the plurality of LSIs to be tested are tested by the concurrent measurement, the output sequence control section and output waveform data generation section can be constituted in one system.

Additionally, the distributed analog test signals are individually optimized for each LSI to be tested by the gain adjustment section and offset adjustment section of the analog waveform generation section.

Accordingly, when the plurality of LSIs to be tested are concurrently tested, the analog test signal optimized for each LSI to be tested can be generated with the simple circuit configuration.

Moreover, in the present invention, since the analog test signals are distributed and optimized in the analog waveform generation section, the test signal can be optimized for each device to perform the concurrent measurement test without complicating the circuit configuration of the performance board or complicating the test program.

Industrial Applicability

As described above, a multiple-output arbitrary waveform generator and mixed LSI tester of the present invention can effectively be used in concurrently testing a plurality of LSIs to be tested.

What is claimed is:

1. A multiple-output arbitrary waveform generator comprising:
    an output waveform data generation section for generating an output waveform data signal for an LSI test;
    an output sequence control section for controlling the output waveform data generation section based on a test sequence specific to an LSI to be tested; and
    an analog waveform generation section for digital/analog-converting an output waveform data signal outputted from the output waveform data generation section to apply the signals to a plurality of LSIs to be tested,
    wherein the analog waveform generation section comprises:
        a gain adjustment section including a plurality of ports via which the analog test signals applied to the plurality of LSIs to be tested are individually outputted to individually adjust gains of the analog test signals outputted via the ports; and
        an offset adjustment section for individually adjusting offset voltages of the analog test signals.

2. The multiple-output arbitrary waveform generator according to claim 1, further comprising:
    a concurrent measurement handling register for selecting a port via which the analog-test signal is outputted from all the ports.

3. A mixed LSI tester comprising: a multiple-output arbitrary waveform generator for generating an analog test signal based on a test sequence specific to a type of an LSI to be tested; and a performance board on which a plurality of LSIs to be tested are laid and in which the analog test signals are applied to the LSIs to be tested, wherein the arbitrary waveform generator comprises:
    an output waveform data generator for generating an output waveform data signal for an LSI test;
    an output sequence control section for controlling the output waveform data generation section based on the test sequence specific to the LSI to be tested; and
    an analog waveform generation section for digital/analog-converting the output waveform data signal outputted from the output waveform data generation section to generate the analog test signals to be applied to the plurality of LSIs to be tested, and
    the analog waveform generation section comprises:
        a gain adjustment section comprising a plurality of ports via which the analog test signals to be applied to the plurality of LSIs to be tested are individually outputted to individually adjust gains of the analog test signals outputted via the ports; and
        an offset adjustment section for individually adjusting offset voltages of the analog test signals.

* * * * *